United States Patent
Tsukagoshi et al.

(10) Patent No.: US 6,411,172 B2
(45) Date of Patent: *Jun. 25, 2002

(54) OSCILLATOR CIRCUIT WITH REDUCED CAPACITY FOR AC COUPLING CAPACITOR

(75) Inventors: Kunihiko Tsukagoshi, Chiba; Satoru Miyabe, Matsudo; Kazuhisa Oyama, Tokyo, all of (JP)

(73) Assignee: Nippon Precision Circuits, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/753,822

(22) Filed: Jan. 3, 2001

Related U.S. Application Data (63) Continuation of application No. 09/218,223, filed on Dec. 21, 1998, now Pat. No. 6,191,661, which is a continuation-in-part of application No. 09/168,906, filed on Oct. 8, 1998, now Pat. No. 6,329,884.

(30) Foreign Application Priority Data

Oct. 30, 1997 (JP) .............................................. 9-298141
Nov. 14, 1997 (JP) .............................................. 9-313019

(51) Int. Cl.[7] ................................................. H03B 5/36
(52) U.S. Cl. ..................... 331/158; 331/74; 331/108 C; 331/116 FE
(58) Field of Search ........................... 331/158, 116 FE, 331/108 C, 74

(56) References Cited

U.S. PATENT DOCUMENTS 4,322,694 A * 3/1982 Morihisa .............. 331/116 FE
6,191,661 B1 * 2/2001 Tsukagoshi et al. ........ 331/158

FOREIGN PATENT DOCUMENTS

| JP | 1-107212 | 7/1989 |
| JP | 07-294602 | 11/1995 |
| JP | 08-032349 | 2/1996 |
| JP | 08-102620 | 4/1996 |

* cited by examiner

Primary Examiner—Arnold Kinkead
(74) Attorney, Agent, or Firm—Schulte Roth & Zabel LLP; Donna L. Angotti; Joel E. Lutzker (57) ABSTRACT

There is disclosed an oscillator circuit in which the first capacitor is connected between the input side of a CMOS inverter in a quartz oscillator circuit and a higher potential side, the second load capacitor is connected between the input side of the inverter and a lower potential side, the third load capacitor is connected between the output side of the inverter and the higher potential side, and the fourth load capacitor is connected between the output side of the inverter and the lower potential side, so that variation in amplitudes of the voltage sources synchronized with the oscillation can be reduced with the realization of lower current consumption. There is also disclosed an oscillator circuit of reduced circuit scale. A CMOS inverter for producing oscillations, an AC coupling capacitor, and a buffer circuit are formed on one chip. A protective circuit that has been heretofore required at the input terminal portion of the buffer circuit can be dispensed with. Therefore, the capacity of the AC coupling capacitor can be reduced. Consequently, the circuit scale can be decreased.

4 Claims, 12 Drawing Sheets

OSCILLATOR CIRCUIT WITH REDUCED CAPACITY FOR AC COUPLING CAPACITOR

This application is continuation of application Ser. No. 09/218,223 filed Dec. 21, 1998, now U.S. Pat. No. 6,191,661, which is a continuation-in-part application of application Ser. No. 09/168,906 filed Oct. 8, 1998, now U.S. Pat. No. 6,329,884 naming the same inventors.

BACKGROUND OF THE INVENTION

1. Field of the Invention

The present invention relates to an oscillator circuit.

2. Description of Related Art

Figure 1A:
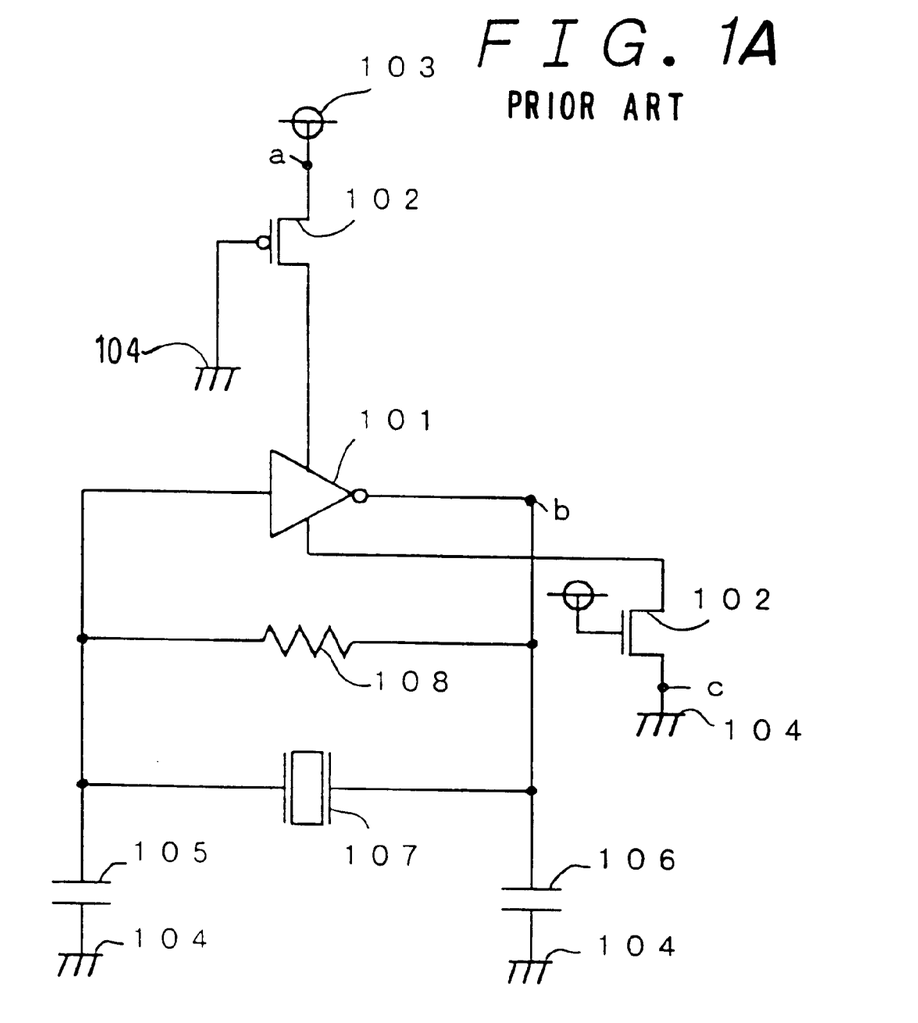
FIG. 1A is a circuit diagram illustrating a configuration of the conventional oscillator circuit.

Heretofore, an oscillator circuit for realizing lower power consumption has been provided with a configuration as shown in FIG. 1. This circuit is described specifically by referring to this figure. A CMOS inverter 101 is connected with a higher-potential power supply 103 and with a lower-potential power supply 104 via current-limiting devices 102 that are used to realize lower power consumption. One electrode of a load capacitor 105 is connected with the input side of the CMOS inverter 101, while the other electrode is connected with the lower-potential power supply 104. One electrode of a load capacitor 106 is connected with the output side of the CMOS inverter 101, whereas the other electrode is connected with the lower-potential power supply 104. Also shown are a quartz oscillator 107 and a feedback resistor 108.

In the above-described configuration, however, the load capacitors 105 and 106 directly connected with the power supplies cause the circuit to have the problem that the power-supply voltages vary greatly in synchronism with the oscillation. Therefore, any circuit using a power supply in common with this oscillator circuit has the disadvantage of becoming unstable in operation. Conversely, where the power-supply voltages are varied by some action independent of the oscillation, there is also the disadvantage that the variations adversely affect the oscillator circuit.

Where an oscillator circuit IC including a CMOS inverter having an externally attached quartz oscillator is connected with a buffer circuit IC, it is common practice to attach an AC coupling capacitor externally to an output of the CMOS inverter within the oscillator circuit and to connect the input terminal of the buffer circuit via the coupling capacitor.

A protective circuit is mounted to the input terminal portion of the buffer circuit. This protective circuit has an electrostatic capacity of about 5 pF. Accordingly, the electrostatic capacity of the AC coupling capacitor is required to be large enough to be capable of canceling out the electrostatic capacity of the protective circuit, e.g., approximately 100 pF. This increases the size of the AC coupling capacitor that must be attached externally. In consequence, the circuit scale is increased.

SUMMARY OF THE INVENTION

In the present invention, the first load capacitor is connected between the input side of a CMOS inverter and one power-supply potential, the second load capacitor is connected between the input side of the CMOS inverter and the other power-supply potential, the third load capacitor is connected between the output side of the CMOS inverter and the one power-supply potential, and the fourth load capacitor is connected between the output side of the CMOS inverter and the other power-supply potential. Thus, variations in the power-supply voltages in synchronism with oscillation can be reduced with the realization of lower electric current consumption.

Since the first and third load capacitors and one power-supply side of the CMOS inverter are coupled to the one power-supply voltage via the first current-limiting device, and the second and fourth load capacitors and the other power-supply side of the CMOS inverter are coupled to the other power-supply voltage via the second current-limiting device, variations in the power-supply voltages in synchronism with oscillation can be reduced further with the realization of lower current consumption.

The first and second current-limiting devices may be resistors.

The first and second current-limiting devices may be transistors.

The first and second current-limiting devices may be constant current circuits.

Each of the first and second current-limiting devices is made of a plurality of switching devices connected in parallel. These switching devices are controlled by a control circuit according to the output from the CMOS inverter. This therefore enables the current-limiting devices to be adjusted, so that optimum adjustment becomes possible. Moreover, for example, by controlling the switching devices so that a large amount of current flows via these switching devices at the start of oscillation and so that a desired amount of current flows after the oscillation has been stabilized, the time between the start of the oscillation and the stabilization of the oscillation can be shortened to enhance the responsiveness.

Further in accordance with the present invention, a CMOS inverter for oscillations, an AC coupling capacitor, and a buffer circuit are formed on one chip, thus dispensing with a protective circuit that would normally be mounted at the input terminal portion of the buffer circuit. Consequently, the electrostatic capacity of the AC coupling capacitor can be reduced and thus the circuit scale can be decreased.

Advantages similar to the foregoing can be obtained by forming the AC coupling capacitor and the buffer circuit on one chip.

An invention as set forth in one aspect lies in an oscillator circuit comprising a CMOS inverter producing an output and a buffer circuit for receiving the output from the inverter via an AC coupling capacitor. A quartz oscillator is connected across input and output of the CMOS inverter. The AC coupling capacitor, the CMOS inverter, and the buffer circuit are formed on one chip.

An invention as set forth in another aspect lies in an oscillator circuit comprising a CMOS inverter producing an output and a buffer circuit for receiving the output from the inverter via an AC coupling capacitor. A quartz oscillator is connected across input and output of the CMOS inverter. The AC coupling capacitor and the buffer circuit are formed on one chip.

DESCRIPTION OF THE PREFERRED EMBODIMENTS

The present invention will be specifically described in the following according to embodiments shown in the figures.

The present invention comprises a CMOS inverter, a piezoelectric device and a feedback resistor each connected between input and output terminals of the CMOS inverter, the first load capacitor connected between the input side of the CMOS inverter and one power-supply potential, the second load capacitor connected between the input side of the CMOS inverter and the other power-supply voltage, the third load capacitor connected between the output side of the CMOS inverter and the one power-supply potential, and the fourth load capacitor connected between the output side of the CMOS inverter and the other power-supply potential.

The first and third load capacitors and the one power-supply side of the CMOS inverter are coupled to the one power-supply voltage via the first current-limiting device, and the second and fourth load capacitors and the other power-supply side of the CMOS inverter are coupled to the other power-supply voltage via the second current-limiting device.

In the embodiments, the above-described first and second current-limiting devices are resistors, transistors, constant current circuits, or a plurality of switching devices connected in parallel which are controlled by a control circuit further provided for controlling the switching devices according to the output from the CMOS inverter. The switching devices are transistors.

First Embodiment

Figure 2:
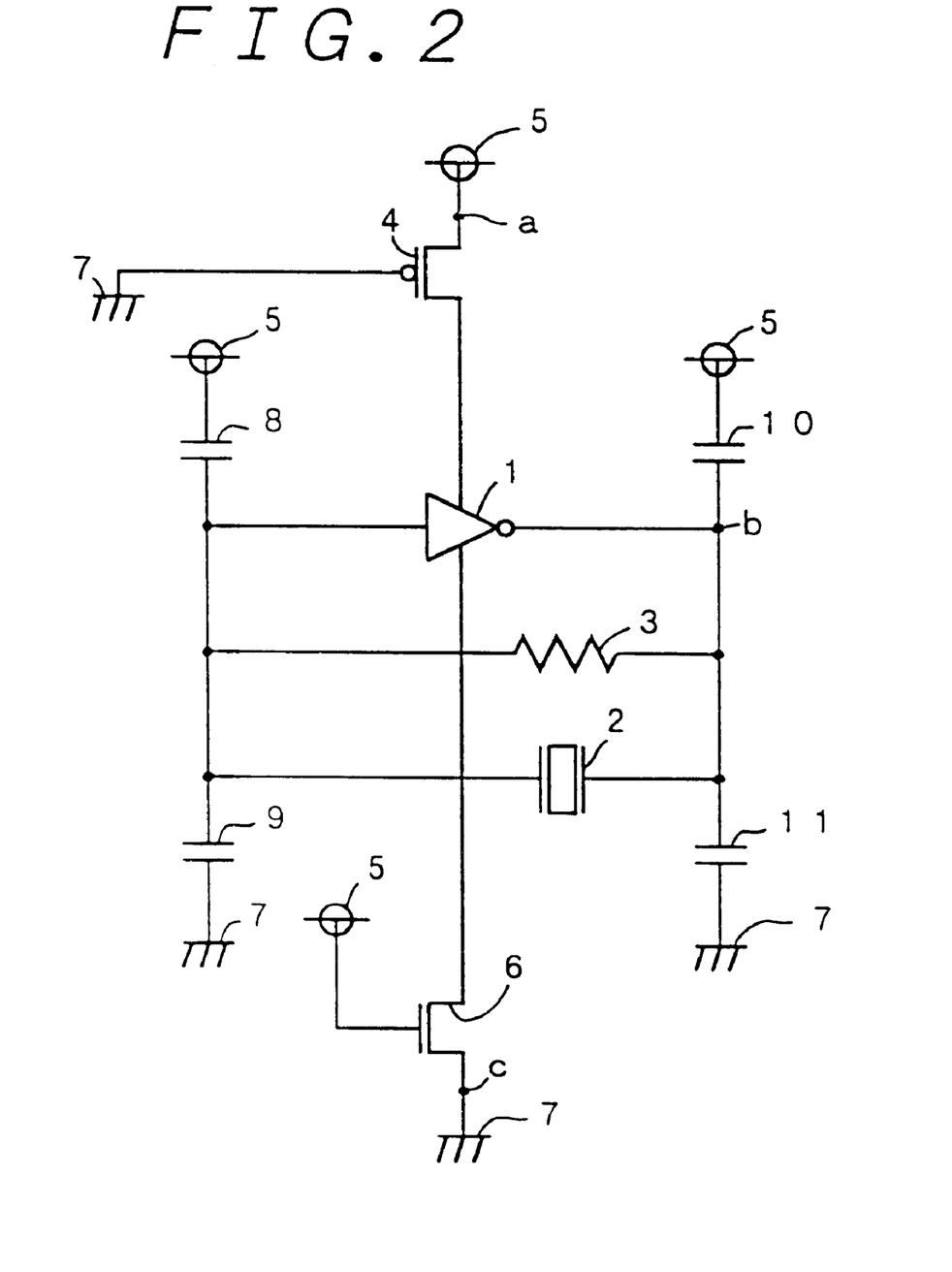
FIG. 2 is a circuit diagram showing an embodiment of the present invention.

Referring to FIG. 2, there are shown a CMOS inverter 1, a quartz oscillator 2 forming a piezoelectric device, and a feedback resistor 3. The quartz oscillator 2 and feedback resistor 3 are connected between the input and output terminals of the CMOS inverter 1. One power-supply terminal of the CMOS inverter 1 is connected with the higher potential side 5 of the power supply via a P-channel MOS transistor 4 forming a current-limiting device. The other power-supply terminal is connected with the lower potential side 7 of the power supply via an N-channel MOS transistor 6 forming a current-limiting device. The gate of the transistor 4 is connected with the lower potential side 7 of the power supply, while the gate of the transistor 6 is connected with the higher potential side 5 of the power supply. Each of the transistors 4 and 6 forms a current-limiting device. The first load capacitor 8 is connected with the input side of the CMOS inverter 1 with one electrode and is connected with the higher potential side 5 with the other electrode. The second load capacitor 9 is connected with the input side of the CMOS inverter 1 with one electrode and is connected with the lower potential side 7 with the other electrode. The third load capacitor 10 is connected with the output side of the CMOS inverter 1 with one electrode and is connected with the higher potential side 5 with the other electrode. The fourth load capacitor 11 is connected with the output side of the CMOS inverter 1 with one electrode and is connected with the lower potential side 7 with the other electrode. In the embodiment, the load capacitors 8 and 9 are made equal in electrostatic capacity. The load capacitors 10 and 11 are also made equal in electrostatic capacity.

Figure 3:
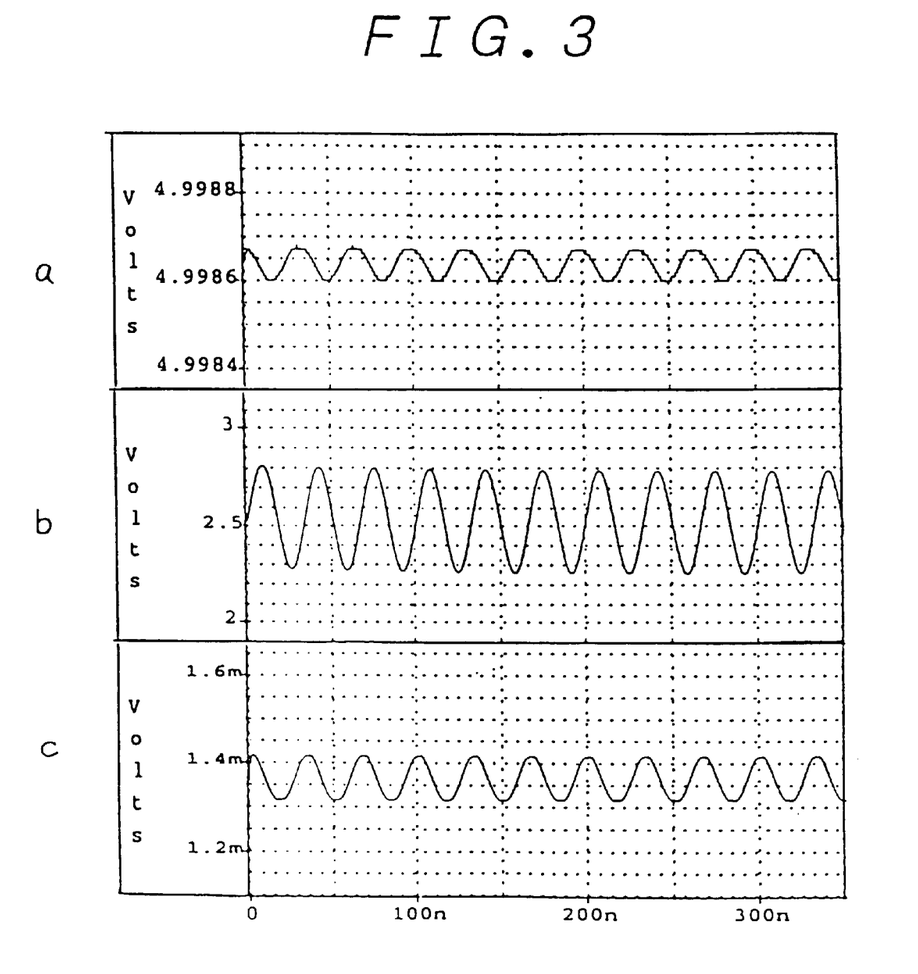
FIG. 3 is a diagram illustrating simulated voltage waveforms when a circuit shown in FIG. 2 is operated.
Figure 4:
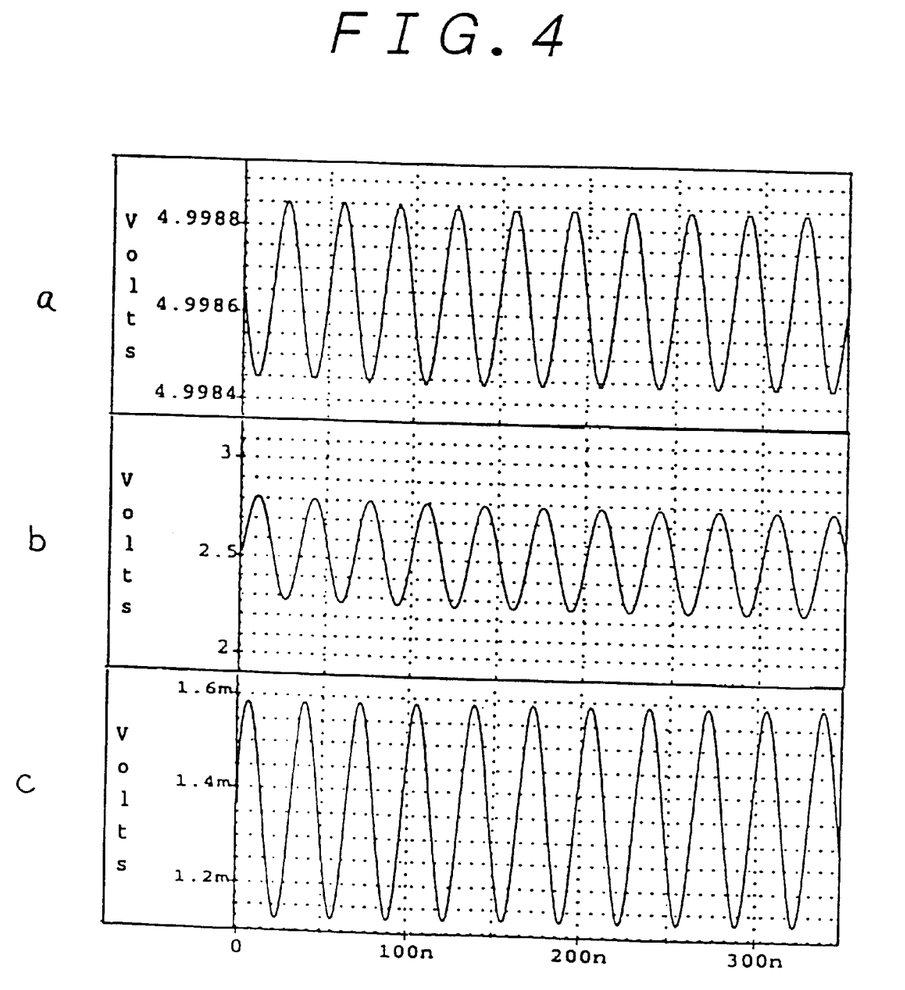
FIG. 4 is a diagram illustrating simulated voltage waveforms when a circuit shown in FIG. 1 is operated.

FIG. 3 is a diagram of the simulated waveforms of the voltages where the circuit with the configuration shown in FIG. 2 is oscillated at 30 MHz. In this figure, waveforms indicated with alphabetical characters a to c are those of the voltages at the terminals a to c shown in FIG. 2, respectively. FIG. 4 shows comparative examples of waveforms with those of FIG. 3, which are the simulated waveforms of the voltages where the circuit with the related art configuration shown in FIG. 1 is oscillated similarly to the case in FIG. 3 (30 MHz). In this figure, waveforms indicated with alphabetic characters a to c are those of the voltages at terminals a to c shown in FIG. 1, respectively. An electrostatic capacity of each of the load capacitors 105 and 106 is taken to be 10 pF. In the case of FIG. 3, each of the load capacitors 8 to 11 have an electrostatic capacity of 5 pF. That is, the load capacitors 8 and 9 share the electrostatic capacity of the load capacitor 105 shown in FIG. 1, and the load capacitors 10 and 11 share the electrostatic capacity of the load capacitor 106.

As is apparent from the comparison of FIGS. 3 and 4, where the outputs from the CMOS inverters 1 and 101 (the waveforms b) are kept in substantially equal level, the magnitude of swings of the power-supply voltages (the waveforms a, c) becomes smaller in the case of FIG. 3.

More specifically, the waveform a (on the higher potential side of the power supply) in the conventional case shown in FIG. 4 shows that the maximum value of the magnitude of the swing is 0.0004 V. Compared with this, in the conventional case shown in FIG. 4, the waveform a (on the higher potential side of the power supply) in the embodiment shown in FIG. 3 shows that the maximum value of the magnitude of the swing is reduced to 0.00007 V. In addition, the waveform c (on the lower potential side of the power supply) in the conventional case shown in FIG. 4 shows that the magnitude of the swing is 0.45 mV at maximum, whereas the waveform c (on the lower potential side of the power supply) in the present embodiment shown in FIG. 3 shows that the maximum value of the magnitude of the swing is reduced to 0.1 mV.

Figure 1B:
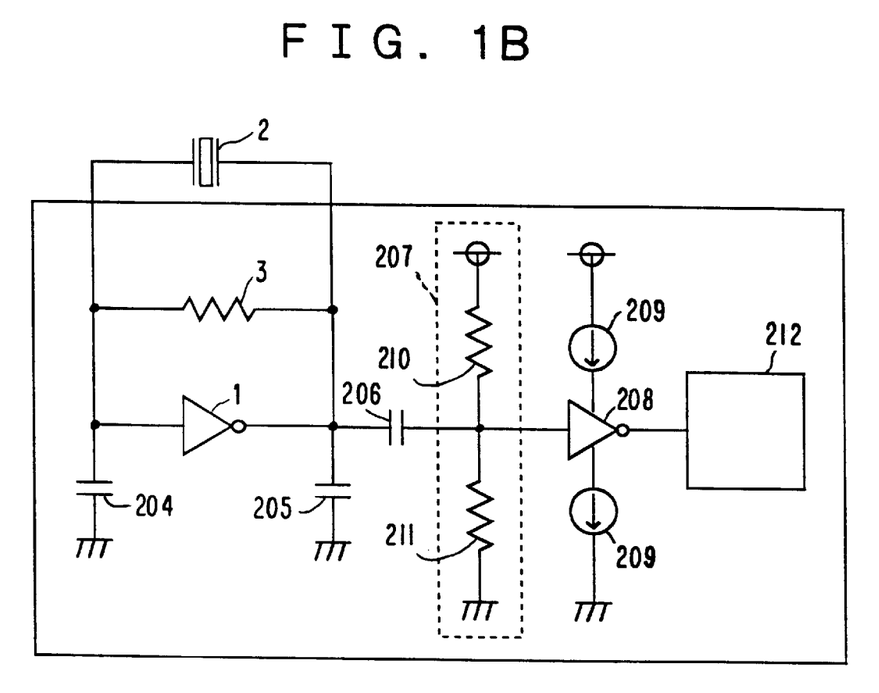
FIG. 1B is a circuit diagram illustrating an aspect of the present invention.

In this way, the first load capacitor 8 is connected between the input side of the CMOS inverter 1 and the higher potential side 5. The second load capacitor 9 is connected between the input side of the CMOS inverter 1 and the lower potential side 7. The third load capacitor 10 is connected between the output side of the CMOS inverter 1 and higher potential side 5. The fourth load capacitor 11 is connected between the output side of the CMOS inverter 1 and the lower potential side 7. Consequently, variations in the power-supply voltages synchronized to the oscillation can be reduced.

Where the oscillator circuit is generally connected with an external circuit, bypass capacitors are connected with the higher potential side 5 and with the lower potential side 7. FIG. 1B illustrates a type of external or desired circuit 212 such as a frequency division circuit that the oscillator circuit is typically connected to. Accordingly, where the first load capacitor 8 and the second load capacitor 9 are made equal in electrostatic capacity and the third load capacitor 10 and the fourth load capacitor 11 are made equal in electrostatic capacity as in the above-described embodiment, variations in the voltages on the higher and lower potential sides connected with each other via the load capacitors can be canceled out by the action of the bypass capacitors. Thus, the power-supply voltages can be better stabilized.

In the above embodiment, transistors are used as the current-limiting devices. The invention, however, is not limited to this. Similar advantages can be obtained by using resistors, constant current circuits, or the like.

Second Embodiment

Figure 5:
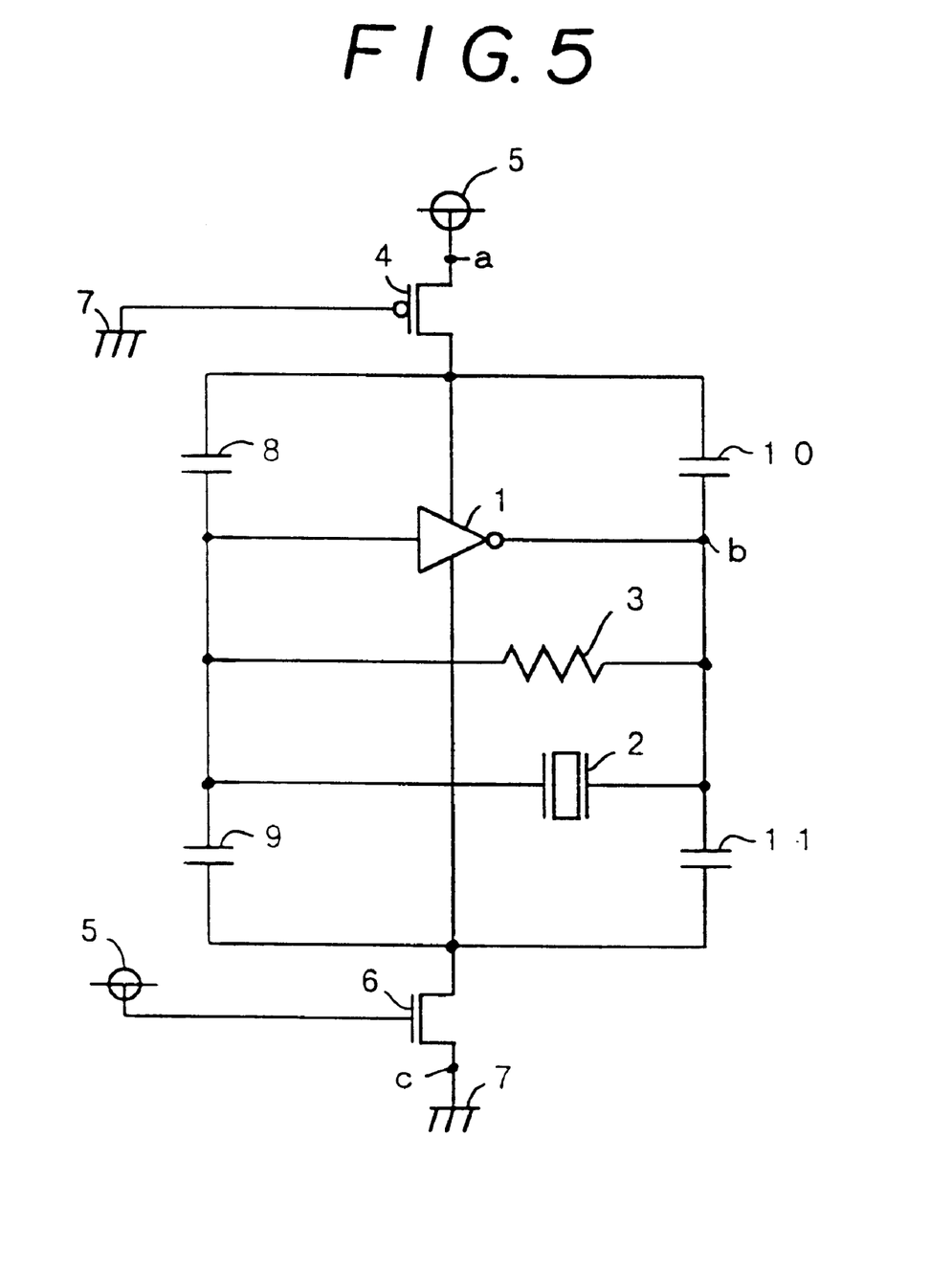
FIG. 5 is a circuit diagram showing another embodiment of the invention.

In the first embodiment show in FIG. 2, the other electrodes of the load capacitors 8 to 11 are directly coupled to the power-supply voltages. As shown in FIG. 5, they can be connected with the power-supply voltages via current-limiting devices 4 and 6, respectively. Like components are indicated by like reference numerals in both FIGS.

Referring specifically to FIG. 5, the other electrodes of the load capacitors 8 and 10 are connected with the higher potential side 5 via the transistor 4 forming a current-limiting device. The other electrodes of the load capacitors 9 and 11 are connected with the lower potential side 7 via the transistor 6 forming a current-limiting device.

Figure 6:
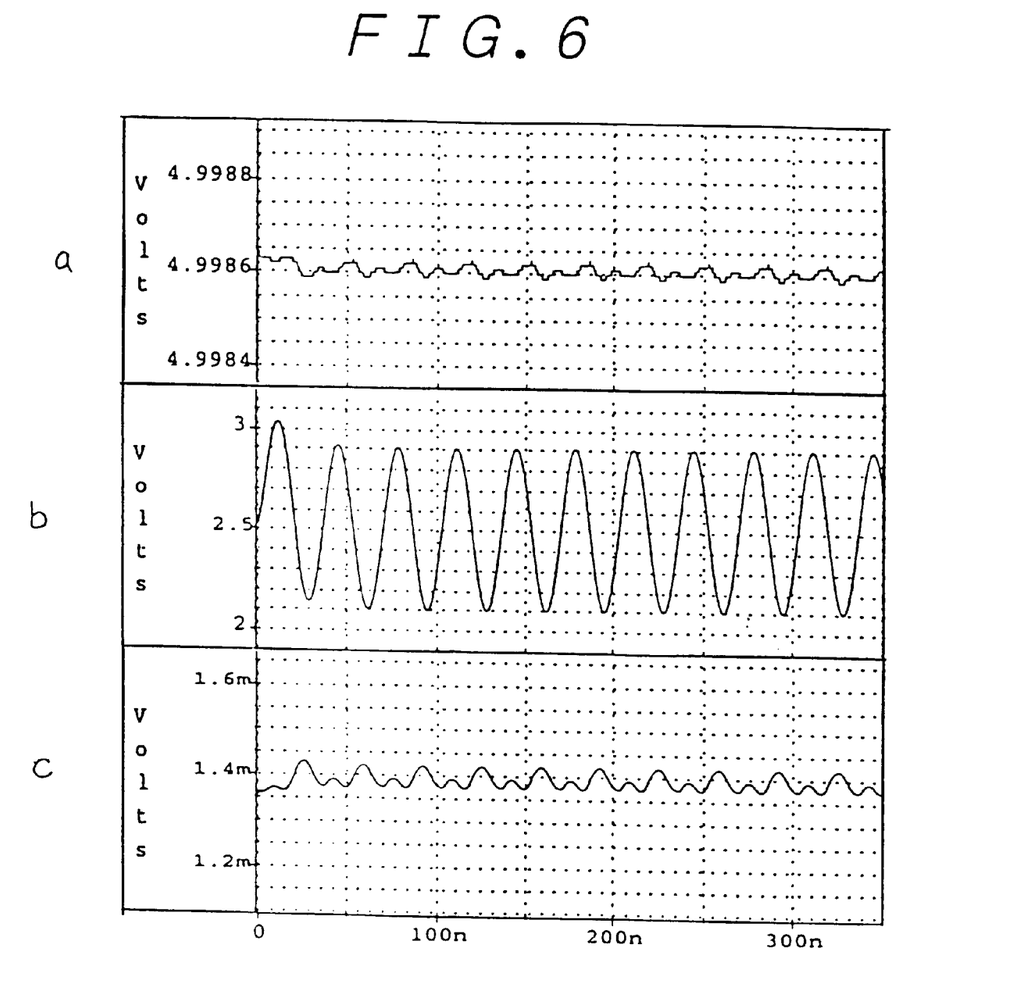
FIG. 6 is a diagram illustrating the voltage waveform when the circuit shown in FIG. 5 is actually operated.

FIG. 6 is a diagram illustrating the waveforms of the voltages for actual oscillations at 30 MHz with the circuit configuration of FIG. 5. In FIG. 6, the waveforms indicated with alphabetical characters a to c are those of the voltages at the terminals a to c shown in FIG. 5, respectively.

Comparison with FIG. 3 that is a waveform diagram of the first embodiment described previously reveals that where the output of the CMOS inverter 1 (the waveform b) is kept substantially at the same level, the magnitude of the swing of the power-supply voltages becomes smaller in the case of FIG. 6.

Specifically, the waveform a (on the higher potential side of the power supply) in the first embodiment shown in FIG. 3 shows that the magnitude of the swing is 0.00007 V at maximum, while the waveform a (on the higher potential side of the power supply) in the second embodiment shown in FIG. 6 shows that the maximum value of the magnitude of the swing is reduced to 0.00004 V. In addition, the waveform c (on the lower potential side of the power supply) the above-described first embodiment shown in FIG. 3 shows that the magnitude of the swing is 0.1 mV at maximum, whereas the waveform c (on the lower potential side of the power supply) in the second embodiment shown in FIG. 6 shows that the maximum value of the magnitude of the swing is decreased to 0.05 mV.

In this way, the other electrodes of the load capacitors 8 and 10 are connected with the higher potential side 5 via the transistor 4, and the other electrodes of the load capacitors 9 and 11 are connected with the lower potential side 7 via the transistor 6. That is, the load capacitors are not directly coupled to the power-supply voltages. Therefore, variations in the power-supply voltages in synchronism with the oscillation can be made smaller than in the case of the first embodiment. When the load capacitors 8 to 11 are coupled to the power-supply voltages, connections are made only via the current-limiting devices without interposing additional capacitive elements. In consequence, adverse effects of noises produced from the power supplies on the oscillation can be reduced.

In the above embodiment, transistors are used as the current-limiting devices. The invention, however, is not limited to this. Similar advantages can be obtained by using resistors, constant current circuits, or the like in the same way as in the first embodiment.

A Variation

In FIG. 1B, a feedback resistor 3 and a quartz oscillator 2 are connected across the input and output of a CMOS inverter 1. Load capacitors 204 and 205 are connected to the input and output, respectively, of the CMOS inverter 1. The CMOS inverter 1, the feedback resistor 3, the quartz oscillator 2, and the load capacitors 204, 205 constitute a quartz oscillator.

The output of the CMOS inverter 1 is connected to the input of a buffer circuit 208 via both an AC coupling capacitor 206 and a signal-adjusting circuit 207. The output of the buffer circuit 208 is connected with a desired circuit 212, such as a frequency division circuit, at the following stage.

The CMOS inverter 1, the feedback resistor 3, the load capacitors 204, 205, the AC coupling capacitor 206, the signal-adjusting circuit 207, and the buffer circuit 208 are formed on one chip. The quartz oscillator 2 is externally attached.

In order to reduce the amount of the consumed current two power terminals of the buffer circuit 208 are connected with power supplies via current-regulated circuits 209, respectively. To match the center of the amplitude of the output generated from the CMOS inverter 1 to the operating point of the buffer circuit 208, the signal-adjusting circuit 207 is mounted in the present embodiment. The signal-adjusting circuit 207 comprises resistors 210 and 211 connected in series between the power supplies. The signal-adjusting circuit 207 adjusts the ratio between the resistances of the resistors 210 and 211, thus adjusting the output level from the CMOS inverter 1. That is, an adjustment is made to match the center of the amplitude of the output from the CMOS inverter 1 to the operating point of the buffer circuit 208.

Since the buffer circuit 208 and the AC coupling capacitor 206 are formed as one chip in this way, a protective circuit that has been heretofore required to be connected to the input terminal portion of the buffer circuit 208 can be dispensed with. Therefore, the capacitive component of the protective circuit does not exist. Consequently, the value of the capacity of the AC coupling capacitor 206 can be reduced. In particular, about 100 pF that has been required heretofore can be reduced down to about 1 pF. That is, the configuration of the AC coupling capacitor 206 can be reduced. If the AC coupling capacitor is made either of a metal such as molybdenum or of a metal such as molybdenum and polysilicon, the size can be decreased further. In addition, the capacity value can be matched accurately. Furthermore, any external attachment operation is unnecessary, because the AC coupling capacitor 206 is mounted on the chip.

Instead of the signal-adjusting circuit 207, a feedback resistor may be connected between the input and output terminals of the buffer circuit 208.

FIG. 1B provides a circuit that is also useful where one or both of the two power terminals of the CMOS inverter 1 are connected with the power supplies via current-regulated circuits, resistors, etc. for reducing the amount of current consumed to form an oscillator circuit as described above.

In the above, the CMOS inverter 1, the feedback resistor 3, the load capacitors 204, 205, the AC coupling capacitor 206, the signal-adjusting circuit 207, and the buffer circuit 208 are formed on one chip. Alternatively, the AC coupling capacitor 206, the signal-adjusting circuit 207, and the buffer circuit 208 may be formed on one chip, which is separate from the CMOS inverter 1, the feedback resistor 3, and the load capacitors 204, 205. Also, in this case, a protective circuit that has been heretofore connected at the input terminal portion of the buffer circuit 208 is dispensed with. Therefore, advantages similar to the foregoing arise.

Another Variation

Figure 7:
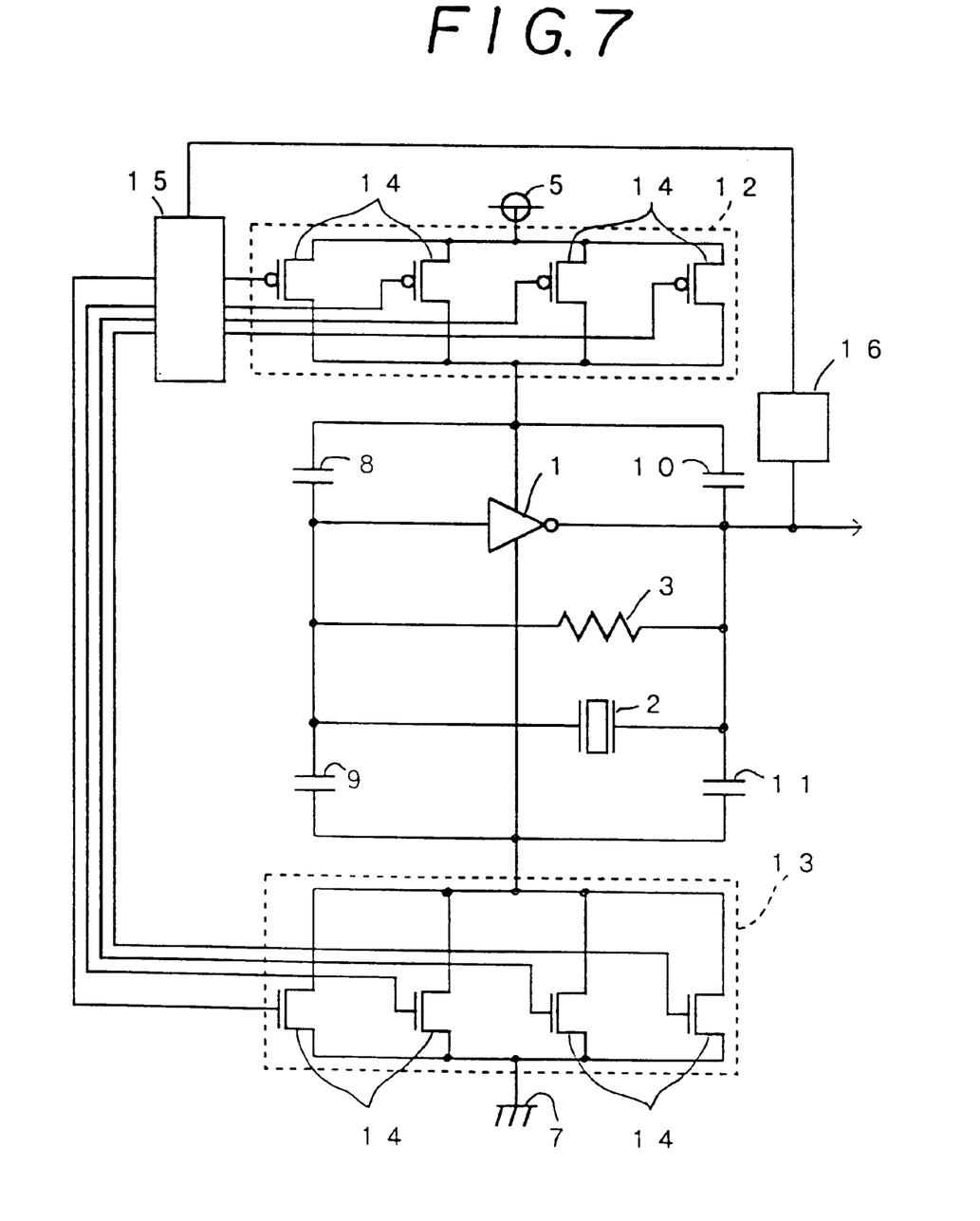
FIG. 7 is a circuit diagram showing a further embodiment of the invention.

Another variation of the invention is next described by referring to FIG. 7, where each current-limiting device of FIG. 5 consists of a plurality of switching devices that are connected in parallel and controlled according to the output from the CMOS inverter 1.

In FIG. 7, each of current-limiting devices 12 and 13 consists of a plurality of transistors 14 connected in parallel. Each of these transistors 14 is formed as a switching device. A control circuit 15 turns on and off the transistors 14 according to the output from the CMOS inverter 1 detected by a later described detection circuit 16. The detection circuit 16 detects the amplitude of the output generated by the CMOS inverter 1 and produces outputs with different output values, depending on whether the amplitude exceeding a prescribed value is obtained or not.

In the configuration described above, the current supplied to the CMOS inverter 1 can be appropriately adjusted according to the number of transistors 14 that are turned on to enable optimum adjustment of the current. For example, when the amplitude of the oscillating output from the CMOS inverter 1 is small at the start of the oscillation, all of these transistors 14 can be turned on to supply a large amount of current into the oscillator circuit. When the detection circuit 16 detects that the oscillation has stabilized and a certain magnitude of amplitude is maintained, turning on and off of the transistors 14 are set in a given condition so as to supply a given amount of current. Thus, the time required from the start of the oscillation to the stabilization of the oscillation can be shortened to enhance the responsiveness.

In the above embodiment, a plurality of transistors connected in parallel are used as switching devices forming current-limiting devices. The invention, however, is not limited to this. For instance, a plurality of constant current circuits each comprising a plurality of transistors may be used in parallel connection. In this case, by controlling the gate voltage of the transistors forming the constant current circuits by the control circuit 15, advantages similar to those in the foregoing can be derived. Where the current is limited by a plurality of resistors connected in parallel, by providing switching devices each connected in series with each of the resistors, and by controlling turning on and off of these switching devices with the control circuit 15, advantages similar to the foregoing can be obtained.

In the above embodiment, a plurality of switching devices are connected in parallel so as to be appropriately controlled according to the output from the detection circuit 16. However, only one current-limiting device may be used according to the design request with, for example, the gate voltage value of this single device may be varied continuously according to the output from the detection circuit 16. This also offers advantages similar to the foregoing.

Figure 8:
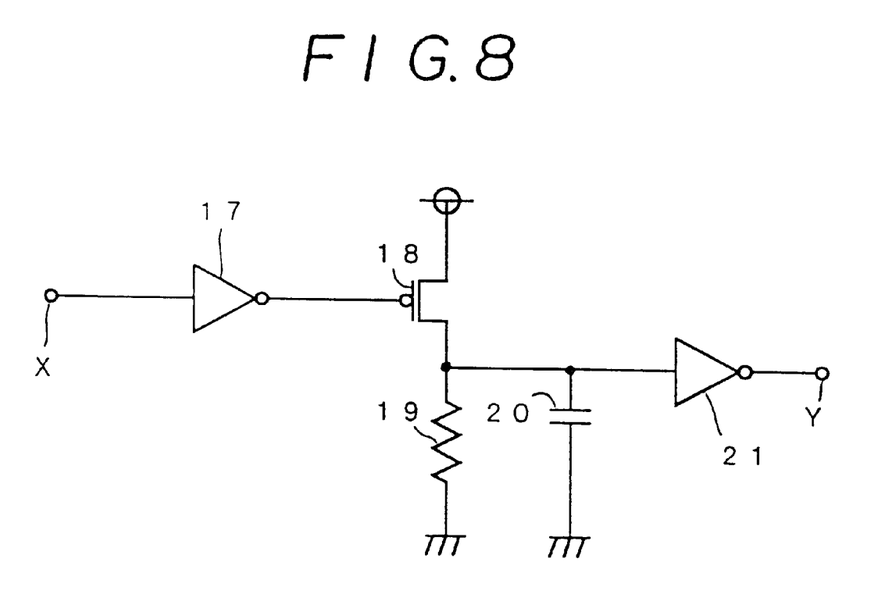
FIG. 8 is a circuit diagram showing an example of a detection circuit in the embodiment of FIG. 7.
Figure 9A:
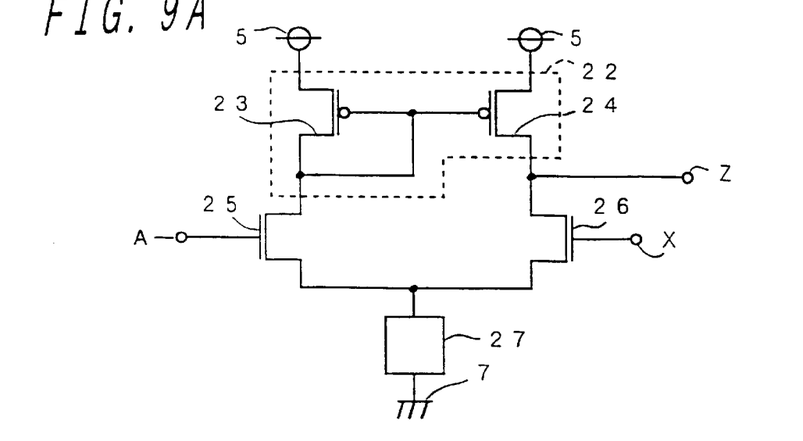
FIG. 9A is a circuit diagram showing an example of a differential amplifier circuit as a main part of another example of the detection circuit in the embodiment of FIG. 7.
Figure 9B:
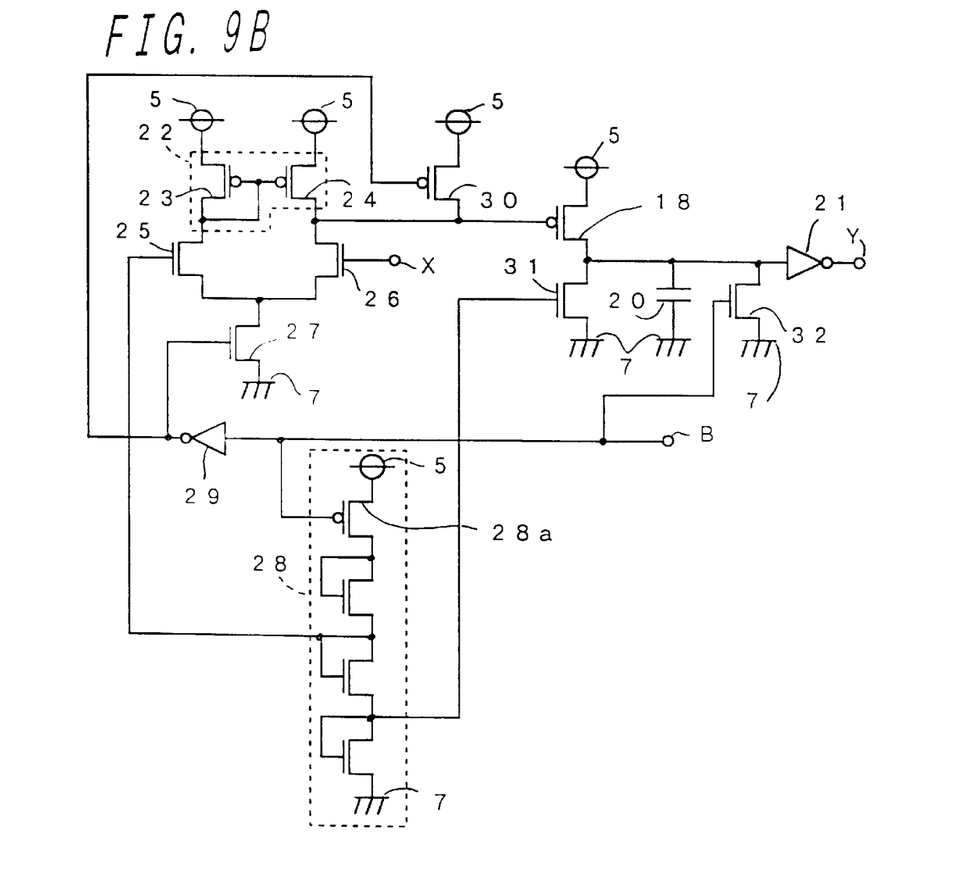
FIG. 9B is a circuit diagram showing another example of the detection circuit in the embodiment of FIG. 7 using the differential amplifier circuit of FIG. 9A.

As the detection circuit 16, that shown in FIGS. 8 or 9B may be used. In FIG. 8, the output from the CMOS inverter 1 is inputted at a terminal X and the detection signal from the detection circuit is outputted to the control circuit 15 through a terminal Y. Specifically, the detected voltage level is established according to the inverted potential (threshold value) from an inverter 17. Since the detailed description of the operation is presented in Unexamined Published Japanese Patent No. 7-193428, the detailed description of the operation is omitted herein. Also shown in this figure are a P-channel MOS transistor 18, a resistor 19, a capacitor 20 and an inverter 21.

In FIG. 8, when the oscillating output voltage from the CMOS inverter 1 is inputted from the terminal X with a large amplitude, the time during which a current flows through the inverter 17 is short. However, when the oscillating output voltage from the CMOS inverter 1 is inputted from the terminal X with a small amplitude, the time during which a current flows through the inverter 17 becomes long. This causes problems where the design demands lower power consumption.

Generally, the threshold value of the inverter 17 is determined by the size of the transistors forming the inverter, so that, when changing the threshold value, it is necessary to change the size of the transistors.

An embodiment free of the above-described problem produced with the inverter 17 of FIG. 8 is shown in FIGS. 9A and 9B. A differential amplifier circuit is used instead of the inverter 17 and current-limiting means are connected with the differential amplifier circuit. That is, the oscillating output is applied to one input of the differential amplifier circuit and a comparison reference voltage for judging the output level is applied to the other input. A connection with the power supply is made via the current-limiting means. Consequently, different oscillating output levels can be detected with the same configuration. Furthermore, the amount of consumed current can be reduced.

FIG. 9A, shows an example of a differential amplifier circuit used instead of the inverter 17 shown in FIG. 8.

In FIG. 9A, a current mirror circuit 22 consists of a pair of P-channel MOS transistors 23, 24. The sources of the transistors 23 and 24 are connected with higher potential sides 5. The drain of the transistor 23 is connected with the gates of the transistors 23 and 24 and with the drain of the N-channel MOS transistor 25. A comparison reference voltage used to establish a threshold value for judging a level of a voltage applied via a terminal A is applied to the gate of the transistor 25. The source of the transistor 25 is connected with the source of the N-channel MOS transistor 26 and with a lower potential side 7 via a current-limiting means 27 comprising a transistor or the like and acting as a constant current source. The drain of the transistor 26 is connected with the drain of the transistor 24 and with the gate of the transistor 18 shown in FIG. 8 via a terminal Z. The gate of the transistor 26 receives the output from the CMOS inverter 1 via a terminal X.

The operation of FIG. 9A is described briefly. When the comparison reference voltage supplied to the gate of the transistor 25 is applied via the terminal A, a threshold value is established according to the applied voltage and compared with the voltage level of the oscillating output applied via the terminal X. When the oscillating output voltage exceeds the threshold value, the voltage at the terminal Z drops. When the voltage level of the oscillating output applied via the terminal X does not exceed the threshold value, the terminal Z is maintained at a high potential.

Consequently, where the inverter 17 in the detection circuit shown in FIG. 8 is replaced by the differential amplifier circuit shown in FIG. 9A, when the voltage level of the oscillating output applied via the terminal X exceeds the threshold value repeatedly, the capacitor 200 is gradually charged to make the output of the inverter 20 be inverted and produce a detection output "0". Conversely, when the voltage level of the oscillating output applied via the terminal X does not exceed the threshold value, the terminal Z is kept at a high potential to turn off the transistor 18 and the capacitor 20 is not charged. Therefore, the inverter 21 does not produce detection output "0".

FIG. 9B shows another example of the detection circuit 16 using the differential amplifier circuit shown in FIG. 9A. In this example, the current flowing through the differential amplifier circuit shown in FIG. 9A is controlled by the signal applied to the terminal B, thus turning on and off of the differential amplifier circuit is controlled. Also, the discharging of electric charge in the capacitor 20 is controlled. Note that in this figure, the same reference numerals as in the previous figure indicate the same components.

In this figure, a voltage source 28 outputs a comparison reference voltage to the gate of a transistor 25. Also shown are an inverter 29, a P-channel MOS transistor 30, and N-channel MOS transistors 31, 32.

The operation is described briefly. In a standby condition, signal "1" is applied to the terminal B, thus turning off a P-channel MOS transistor 28a in the voltage source 28. At the same time, the transistor 32 is turned on and discharges the capacitor 20 to bring it in the initial state. Therefore, at this time, i.e., in a standby condition, the input to the inverter 21 is "0" and "1" is produced at the output terminal Y. The inverted output "0" from the inverter 29 turns off the transistor 27, stopping the supply of current into the differential amplifier circuit shown in FIG. 9A. Therefore, in a stand by condition, useless current does not flow into the circuit shown in FIG. 9A. This allows lower current consumption. Inverted output "0" from the inverter 29 turns on the transistor 30. Concomitantly, the transistor 18 is turned off. Since the voltage source 28 has been turned off, the transistor 31 is also turned off. Consequently, the capacitor 20 is prevented from being charged. Accordingly, the drawback of uselessly charging the capacitor 20 in a standby condition can be eliminated. Hence, lower power consumption is accomplished.

Figure 10:
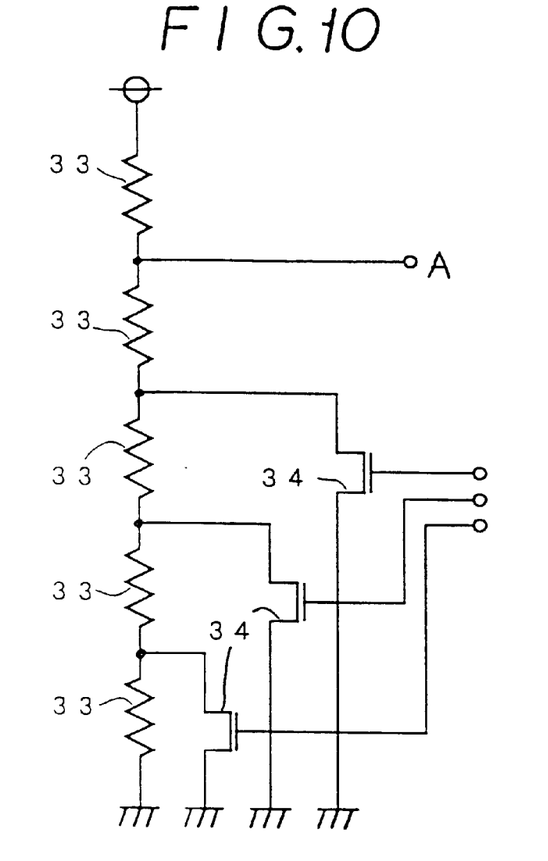
FIG. 10 is a circuit diagram showing another example of a voltage source in the detection circuit of FIG. 9B.
Figure 11:
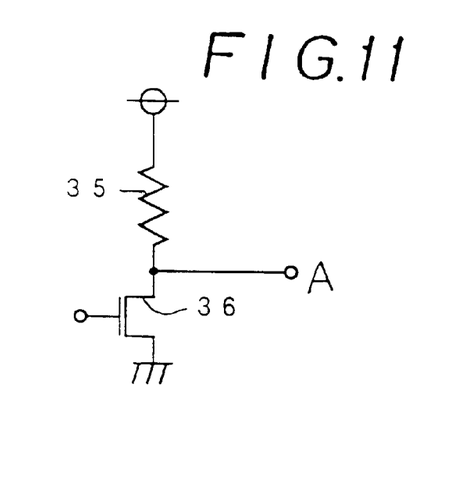
FIG. 11 is a circuit diagram of a further example of the voltage source in the detection circuit of FIG. 9B.

When the circuit becomes in operation and signal "0" is inputted to the terminal B, the transistor 32 is turned off, stopping the capacitor 20 from being in the initial state. The voltage source 28 is turned on, and the comparison reference voltage is outputted to the gate of the transistor 25. At the same time, the transistor 31 is turned on. Inverted output "1" from the inverter 29 operates the transistor 27 and turns off the transistor 30. This permits the circuit shown in FIG. 9A to operate. Under this condition, when the output from the CMOS inverter 1 is applied from the terminal X, the same operation as the foregoing is performed.

Where the differential amplifier circuit shown in FIG. 9A is adopted, the threshold value can be easily varied by changing the comparison reference voltage applied to the gate of the transistor 25. Furthermore, the comparison reference voltage can be adjusted by the signal from other circuit block of the IC. In addition, the voltage may be adjusted by directly applying a voltage from the outside of the IC. For example, a plurality of resistors 33 may be connected in series across power supplies as shown in FIG. 10 with one terminal of the junctions of the resistors 33 being connected with the gate of the transistor 25 shown in FIGS. 9A and 9B, the other junctions being connected with the power supply via transistors 34, and the gates of the transistors 34 being controlled by binary signals from other circuit block in the IC or binary signals from the outside of the IC, thereby making digital adjustment. Alternatively, as shown in FIG. 11, a resistor 35 and a transistor 36 may be connected across power supplies with the junction being connected with the gate of the transistor 25 shown in FIGS. 9A and 9B, and the gate of the transistor 36 being controlled by an analog signal from other circuit block within the IC or an analog signal from the outside of the IC, thereby adjusting the comparison reference voltage in an analog manner.

Figure 12A:
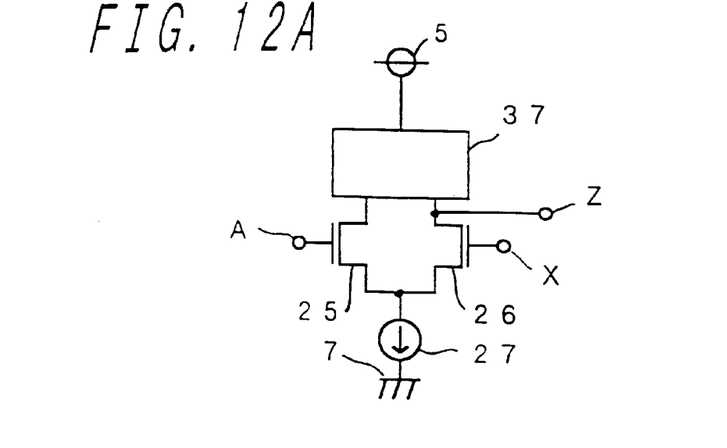
FIGS. 12A to 12C are circuit diagrams of other examples of differential amplifier circuits in the detection circuit of FIG. 9B.
Figure 12B:
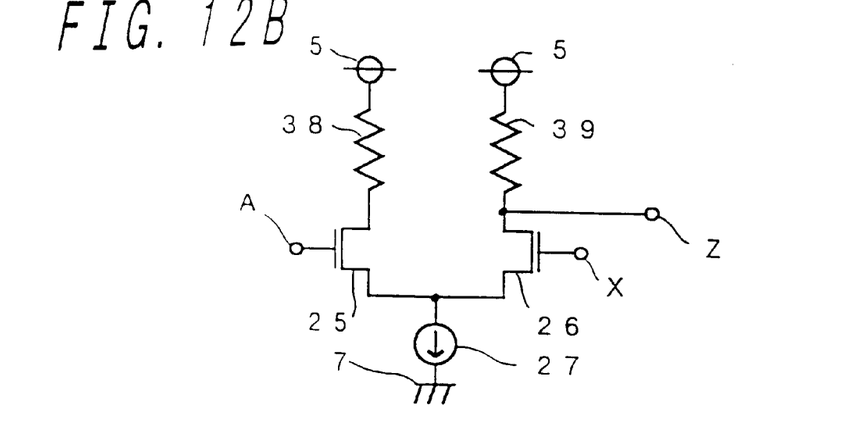
Figure 12C:
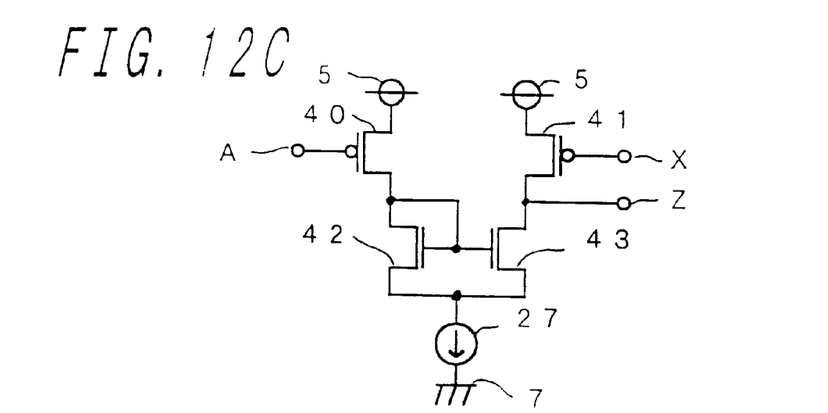

In the above-described embodiment, the circuit shown in FIG. 9A is used as the differential amplifier circuit. However, the differential amplifier circuit is not limited to this type. For example, those shown in FIGS. 12A, 12B and 12C may be used. Shown in these figures are an active load 37, resistors 38 and 39, P-channel MOS transistors 40 and 41, N-channel MOS transistors 42 and 43. Note that the same components as those in the previous figures are indicated by the same reference numerals.

In the above-described embodiments, current-limiting devices are mounted on both higher and lower potential sides. The current-limiting devices, however, may be mounted only on one side according to design requirement.

According to the present invention, variations in the power-supply voltages synchronized with oscillation can be reduced while accomplishing lower power consumption.

The first load capacitor with the one electrode thereof being connected with the input side of a CMOS inverter, the third load capacitor with the one electrode thereof being connected with the output side of the CMOS inverter, and the one power supply side of the CMOS inverter are coupled to the one power-supply voltage via the first current-limiting device. Moreover, the second load capacitor with the one electrode thereof being connected with the input side of the CMOS inverter, the fourth load capacitor with the one electrode thereof being connected with the output side of the CMOS inverter, and the other power supply side of the CMOS inverter are coupled to the other power supply side via the second current-limiting device. Therefore, variations in the power-supply voltages synchronized with the oscillation can be reduced further while realizing lower power consumption.

Each of the first and second current-limiting devices is made to have a plurality of switching devices connected in parallel. These switching devices are controlled according to the output from the CMOS inverter by a control circuit. Therefore, the current in the current-limiting devices can be adjusted to enable optimum current adjustment. In addition, for example, by controlling the switching devices so that a large amount of current flows via these switching devices at the start of oscillation and that a given amount of current flows after the oscillation has been stabilized, the time required from the start of the oscillation to the stabilization of the oscillation can be shortened to improve the response.

Further, in accordance with the present invention, a protective circuit that has been heretofore connected with the input terminal portion of the buffer circuit can be made unnecessary. Therefore, the capacity of the AC coupling capacitor can be reduced. Hence, the circuit scale can be decreased.

Although the invention has been described with reference to the preferred embodiments, it will be apparent to one skilled in the art that variations and modifications are contemplated within the spirit and scope of the invention. For example, the various advantageous features of the disclosed invention may be combined to generate additional embodiments. The drawings and description of the preferred embodiments are made by way of example rather than to limit the scope of the invention, and it is to cover within the spirit and scope of the invention all such changes and modifications.

What is claimed is:

1. In an oscillator circuit having a CMOS inverter, a quartz oscillator connected between input and output of the inverter, an AC coupling capacitor, and a buffer circuit for receiving an output from the CMOS inverter via the AC coupling capacitor, the improvement wherein said AC coupling capacitor, a signal adjusting circuit and said buffer circuit are formed on one chip and wherein said CMOS inverter and said quartz oscillator are not formed on said one chip.

2. In an oscillator circuit as recited in claim 1, said CMOS inverter having current limiting devices for connection to power.

3. In an oscillator circuit as recited in claim 1, said CMOS inverter having:

a first load capacitor connected between the input of the CMOS inverter and one power-supply potential;

a second load capacitor connected between the input of the CMOS inverter and another power-supply voltage;

a third load capacitor connected between the output of the CMOS inverter and the one power-supply potential; and a fourth load capacitor connected between the output side of the CMOS inverter and said other power-supply voltage.

4. In an oscillator circuit as recited in claim 3 wherein said first and third load capacitor and one power-supply side of said CMOS inverter are coupled to said one power-supply voltage via a first current-limiting device, and said second and fourth load capacitors and the other power-supply side of said CMOS inverter are coupled to the other power-supply voltage via a second current-limiting device.

* * * * *